(12) United States Patent
Ebisuno et al.

(10) Patent No.: US 11,563,126 B2
(45) Date of Patent: Jan. 24, 2023

(54) METHOD OF MANUFACTURING THIN FILM TRANSISTOR AND DISPLAY DEVICE INCLUDING POLISHING CAPPING LAYER COPLANAR WITH ACTIVE LAYER

(71) Applicant: SAMSUNG DISPLAY CO., LTD., Yongin-si (KR)

(72) Inventors: Kohei Ebisuno, Yongin-si (KR); Sungjun Kim, Yongin-si (KR); Donghyun Son, Yongin-si (KR); Jaesoo Jung, Yongin-si (KR); Sunghoon Moon, Yongin-si (KR); Jingoo Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 43 days.

(21) Appl. No.: 17/348,188

(22) Filed: Jun. 15, 2021

(65) Prior Publication Data
US 2021/0313474 A1    Oct. 7, 2021

Related U.S. Application Data

(63) Continuation of application No. 16/414,266, filed on May 16, 2019, now Pat. No. 11,063,155.

(30) Foreign Application Priority Data

Dec. 6, 2018    (KR) .......................... 10-2018-0156282

(51) Int. Cl.
*H01L 29/786*    (2006.01)
*H01L 27/32*    (2006.01)
(Continued)

(52) U.S. Cl.
CPC .. *H01L 29/78696* (2013.01); *H01L 21/02164* (2013.01); *H01L 21/02532* (2013.01);
(Continued)

(58) Field of Classification Search
CPC ............ H01L 27/1222; H01L 27/3262; H01L 29/78696; H01L 29/66757; H01L 29/78675
(Continued)

(56) References Cited

U.S. PATENT DOCUMENTS 6,953,714 B2 * 10/2005 Kimura ................. H01L 21/268
                                                        438/164
9,487,675 B2   11/2016 Raman et al.
(Continued)

FOREIGN PATENT DOCUMENTS

JP    3471966    9/2003
JP    6013504    9/2016
(Continued)

OTHER PUBLICATIONS

M. Cao, et al., "A High-Performance Polysilicon Thin-Film Transistor Using XeCl Excimer Laser Crystallization of Pre-Patterned Amorphous Si Films", IEEE Transactions on Electron Devices, vol. 43, No. 4, Apr. 1996, pp. 561-567.
(Continued)

*Primary Examiner* — Matthew E. Gordon
(74) *Attorney, Agent, or Firm* — F. Chau & Associates, LLC

(57) ABSTRACT

A thin film transistor includes an active layer including a first portion having a first thickness and a second portion having a second thickness greater than the first thickness, a capping layer filling a thickness difference between the first portion and the second portion and arranged on the first portion, a gate insulating layer arranged on the capping layer, a gate electrode on the active layer, wherein the gate insulating layer and the capping layer are disposed between the gate electrode and the active layer, and a source electrode and a drain electrode connected to the active layer.

12 Claims, 8 Drawing Sheets

(51) Int. Cl.
*H01L 27/12* (2006.01)
*H01L 21/02* (2006.01)
*H01L 21/306* (2006.01)
*H01L 29/66* (2006.01)

(52) U.S. Cl.
CPC .. *H01L 21/02592* (2013.01); *H01L 21/02672* (2013.01); *H01L 21/02675* (2013.01); *H01L 21/30625* (2013.01); *H01L 27/1222* (2013.01); *H01L 27/1281* (2013.01); *H01L 27/3262* (2013.01); *H01L 29/66757* (2013.01); *H01L 29/78675* (2013.01); *H01L 2227/323* (2013.01)

(58) Field of Classification Search
USPC .......................................................... 257/40
See application file for complete search history.

(56) References Cited

U.S. PATENT DOCUMENTS

| | | | |
|---|---|---|---|
| 2005/0029591 A1* | 2/2005 | Yudasaka | H01L 29/78636 438/149 |
| 2006/0263950 A1 | 11/2006 | Kim et al. | |
| 2017/0040462 A1* | 2/2017 | Lu | H01L 29/78618 |
| 2020/0185537 A1 | 6/2020 | Ebisuno et al. | |

FOREIGN PATENT DOCUMENTS

| | | |
|---|---|---|
| KR | 10-0592264 | 6/2006 |
| KR | 10-0718265 | 5/2007 |
| KR | 10-0737438 | 7/2007 |

OTHER PUBLICATIONS

M. Hee, et al., "Effects of Capping Layer on Grain Growth with µ-Czochralski Process during Excimer Laser Crystallation", Japanese Journal of Applied Physics, vol. 45, No. 1 (7 pages).

M. Kang, et al., "Effect of SiO2 Capping Layer on a Laser Crystallization of a—Si Thin Film", Mat. Res. Soc. Symp. Proc. vol. 762 ? 2003 Materials Research Society, pp. A17.3.1-A17.3.6.

P. Ch. van der Wilt, et al., "Formation of Location-Controlled Crystalline Islands Using Substrate-Embedded Seeds in Excimer-Laser Crystallization of Silicon Films", Applied Physics Letters vol. 79, No. 12, Sep. 17, 2001, pp. 1819-1821.

R. Ishihara, et al., "Single-Grain-Si TFTs With ECR-PECVD Gate SiO2", IEEE Transactions on Electron Devices, vol. 51, No. 3, Mar. 2004, pp. 500-502.

R. Vikas, et al., "High Performance Single Grain Si TFTs Inside a Location-Controlled Grain by µ-Czochralski Process with Capping Layer", IEEE International Electron Devices Meeting, 2005, IEDM Technical Digest, 4 pages.

W. Yeh, et al., "Proposed Sample Structure for Marked Enlargement of Excimer-Laser-Induced Lateral Grain Growth in Si Thin Films", Jpn. J. Appl. Phys. vol. 41 (2002) pp. 1909-1914.

* cited by examiner

METHOD OF MANUFACTURING THIN FILM TRANSISTOR AND DISPLAY DEVICE INCLUDING POLISHING CAPPING LAYER COPLANAR WITH ACTIVE LAYER

CROSS-REFERENCE TO RELATED APPLICATION

This application is a continuation of U.S. application Ser. No. 16/414,266 filed on May 16, 2019, which claims priority under 35 U.S.C. 119 to Korean Patent Application No. 10-2018-0156282, filed on Dec. 6, 2018 in the Korean Intellectual Property Office, the disclosure of which is incorporated by reference herein in its entirety.

BACKGROUND

1. Field

The present invention relate to a thin film transistor used in a display device, and more particularly, to a thin film transistor with an active layer partially covered with a capping layer and a method of manufacturing the thin film transistor, a display device including the thin film transistor, and a method of manufacturing the thin film transistor and the display device.

2. Description of the Related Art

Display devices such as organic light-emitting display devices or liquid crystal display devices include thin film transistors configured to drive each pixel, and each thin film transistor includes an active layer. The active layer in an amorphous state is formed over a substrate and then crystallized through an appropriate heat treatment process.

Recently, as display devices have high resolution, it is required that an active layer of a thin film transistor has a high charge mobility characteristic. For this, to form an active layer, a method is used in which an amorphous silicon layer is formed first, a capping layer covers the amorphous silicon layer, and then annealing is performed to increase a heating efficiency, and thus a grain size of a crystallized silicon layer is increased. That is, the mobility of a charge is raised by increasing a grain size of crystalline silicon of the active layer.

SUMMARY

However, when a grain size is increased, a protuberance that protuberates from a surface at a boundary between grains becomes large. That is, while amorphous silicon transforms into crystalline silicon during an annealing operation, grains grow and collide to form a boundary, and a protuberance protuberates from a surface at a grain boundary, which is a boundary between grains. As a grain size increases, the protuberance also increases.

When the protuberance becomes large, an electric field is concentrated on a cutting edge thereof, and an electric characteristic of a device such as a breakdown voltage or hot carrier injection may become very unstable, and as a result, the reliability of a product may be seriously influenced.

One or more embodiments include a thin film transistor having an improved characteristic to alleviate concentration of an electric field on a grain boundary protuberance while having a large grain size of an active layer, and a display device including the thin film transistor, and a method of manufacturing the thin film transistor and the display device.

Additional aspects will be set forth in part in the description which follows and, in part, will be apparent from the description, or may be learned by practice of the presented embodiments.

According to an exemplary embodiment of the present invention, a thin film transistor includes an active layer including a first portion having a first thickness and a second portion having a second thickness greater than the first thickness, a capping layer filling a thickness difference between the first portion and the second portion and arranged on the first portion, a gate insulating layer arranged on the capping layer, a gate electrode on the active layer, wherein the gate insulating layer and the capping layer are disposed between the gate electrode and the active layer, and a source electrode and a drain electrode connected to the active layer.

According to an exemplary embodiment of the present invention, a display device includes a substrate and a thin film transistor on the substrate and a light-emitting element connected to the thin film transistor. The thin film transistor includes an active layer including a first portion having a first thickness and a second portion having a second thickness greater than the first thickness, a capping layer filling a thickness difference between the first portion and the second portion and arranged on the first portion, a gate insulating layer arranged on the capping layer, a gate electrode on the active layer, wherein the gate insulating layer and the capping layer are disposed between the gate electrode and the active layer, and a source electrode and a drain electrode connected to the active layer.

According to an exemplary embodiment of the present invention, a method of manufacturing a thin film transistor is provided as follows. An amorphous silicon layer is formed over a substrate. A preliminary capping layer is formed on the amorphous silicon layer. A crystalline silicon layer with a protuberance is formed by performing heat treatment on the amorphous silicon layer in which the amorphous silicon layer is liquidized and then the liquidized amorphous silicon layer is crystallized to form the crystalline silicon layer with the protuberance and the preliminary capping layer is deformed to a shape of the protuberance. The deformed preliminary capping layer and the protuberance are formed to form a first capping layer and a second capping layer, and an active layer having a first portion having a first thickness and a second portion having a second thickness respectively. The second portion separates the first capping layer and the second capping layer. A gate insulating layer is formed on the first capping layer, the second capping layer and the second portion of the active layer. A gate electrode is formed on the gate insulating layer, the gate electrode overlapping the active layer. A source electrode and a drain electrode are formed to penetrate the first capping layer and the second capping layer respectively to be connected to the active layer According to an exemplary embodiment of the present invention, a method of manufacturing a display device is provided as follow. A thin film transistor and a light-emitting element are formed over a substrate. The light-emitting element is connected to the thin film transistor. The forming of the thin film transistor includes forming of an amorphous silicon layer over the substrate, forming of a preliminary capping layer on the amorphous silicon layer, forming of a crystalline silicon layer with a protuberance by performing heat treatment on the amorphous silicon layer in which the amorphous silicon layer is liquidized and then the liquidized amorphous silicon layer is crystallized to form the crystalline silicon layer with the protuberance and the preliminary capping layer is deformed to a shape of the protuberance, polishing of the deformed preliminary capping layer and the protuberance to form a first capping layer and a second capping layer, and an active layer including a first portion having a first thickness and a second portion having a second thickness greater than the first thickness respectively, wherein the second portion separates the first capping layer and the second capping layer, forming of a gate insulating layer on the first capping layer, the second capping layer and the second portion of the active layer, forming of a gate electrode on the gate insulating layer, the gate electrode overlapping the active layer, forming of a source electrode and a drain electrode that penetrate the first capping layer and the second capping layer respectively to be connected to the active layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF EXEMPLARY EMBODIMENT

Figure 1:
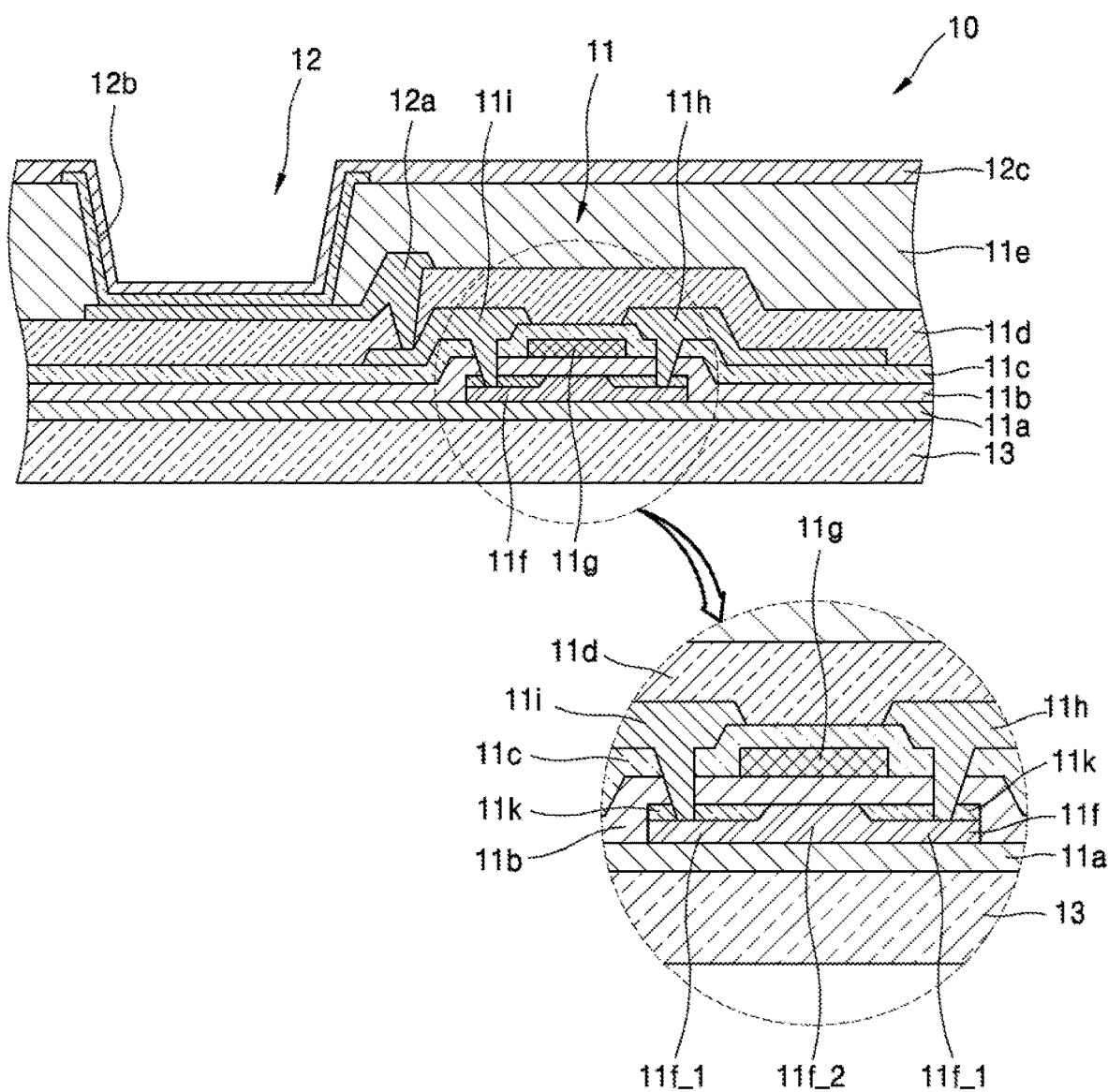
FIG. 1 is a cross-sectional view of a structure of a display device including a thin film transistor, according to an embodiment of the present invention.

As the disclosure allows for various changes and numerous embodiments, example embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

FIG. 1 is a cross-sectional view of a portion of a display device 10 including a thin film transistor 11, according to an embodiment.

As shown, the display device 10 includes the thin film transistor 11 and a light-emitting element 12.

First, the light-emitting element 12 is driven by the thin film transistor 11 and emits light to produce an image. The light-emitting element 12 includes a pixel electrode 12a and an opposite electrode 12c facing each other, and an emission layer 12b therebetween.

A constant voltage is applied to the opposite electrode 12c, and a voltage is selectively applied by the thin film transistor 11 to the pixel electrode 12a connected to the thin film transistor 11. Therefore, when a proper voltage is applied between the two electrodes, that is, the pixel electrode 12a and the opposite electrode 12c, depending on the selective voltage application of the thin film transistor 11, the emission layer 12b between the two electrodes, that is, the pixel electrode 12a and the opposite electrode 12c, emits light so that the light-emitting element 12 produces an image.

Also, the thin film transistor 11 includes an active layer 11f, a gate electrode 11g, a source electrode 11h, and a drain electrode 11i that are disposed on a substrate 13. In operation of the thin film transistor 11, when an electric signal is applied to the gate electrode 11g, electric conduction from the source electrode 11h to the drain electrode 11i may occur in the active layer 11f, and thus a voltage is applied to the pixel electrode 12a connected to the drain electrode 11i and light emission of the emission layer 12b is induced as described above.

A reference numeral 11a represents a buffer layer arranged between the substrate 13 and the active layer 11f, a reference numeral 11b represents a gate insulating layer, a reference numeral 11c represents an interlayer insulating layer, a reference numeral 11d represents a passivation layer, and a reference numeral 11e represents a planarization layer.

For reference, a hole injection layer (HIL), a hole transport layer (HTL), an electron transport layer (ETL), an electron injection layer (EIL), etc. may be further stacked adjacent to the emission layer 12b of the light-emitting element 12. Also, the emission layer 12b may be separately disposed in each sub-pixel, and thus a sub-pixel for red light, a sub-pixel for green light, and a sub-pixel for blue light may constitute one unit pixel. Alternatively, the emission layer 12b may be formed in common over an entire pixel area regardless of a location of a pixel. In this case, multiple layers may be vertically stacked or combined to constitute the emission layer 12b. For example, the emission layer 12b may include a first layer having a light-emitting material for red light, a second layer having a light-emitting material for green light and a third layer having a light-emitting material for blue light. When the emission layer 12b emits white light, different colors may be combined to generate the white light. Also, a color conversion layer or a color filter configured to convert the emitted white light into light of a predetermined color may be further provided. Also, a thin-film encapsulation layer (not shown), in which an organic layer and an inorganic layer are stacked in turn, may be formed on the opposite electrode 12c.

The active layer 11f includes a first portion 11f_1 that is relatively thin and a second portion 11f_2 that is relatively thick. For example, the first portion 11f_1 has a first thickness, and the second portion 11f_2 has a second thickness greater than the first thickness. For example, the first portion 11f_1 has a top surface lower than a top surface of the second portion 11f_2 with respect to an upper surface of the substrate 13. In an exemplary embodiment, the top surface of the first portion 11f_1 is connected to the top surface of the second portion 11f_2 via a sloped side surface. A capping layer 11k is formed on the first portion 11f_1 while filling a thickness difference between the first and second portions 11f_1 and 11f2, the capping layer 11k including an oxide material, for example, silicon oxide such as $SiO_2$. In an exemplary embodiment, the capping layer 11k may have a thickness substantially equal to the thickness difference between the first and second portions 11f_1 and 11f_2. In an exemplary embodiment, a top surface of the capping layer 11k may be positioned at substantially the same height as a top surface of the second portion 11f_2 with reference to the upper surface of the substrate 13.

Figure 2A:
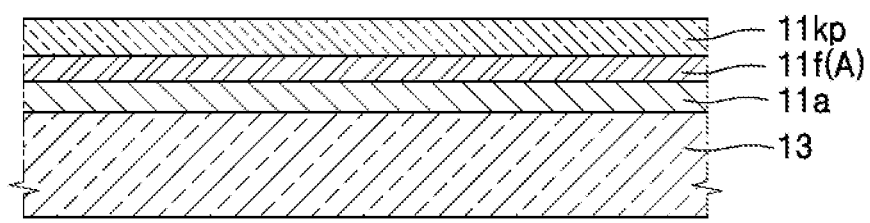
FIGS. 2A to 2F are sequential cross-sectional views of a process of manufacturing the thin film transistor shown in FIG. 1.
Figure 2B:
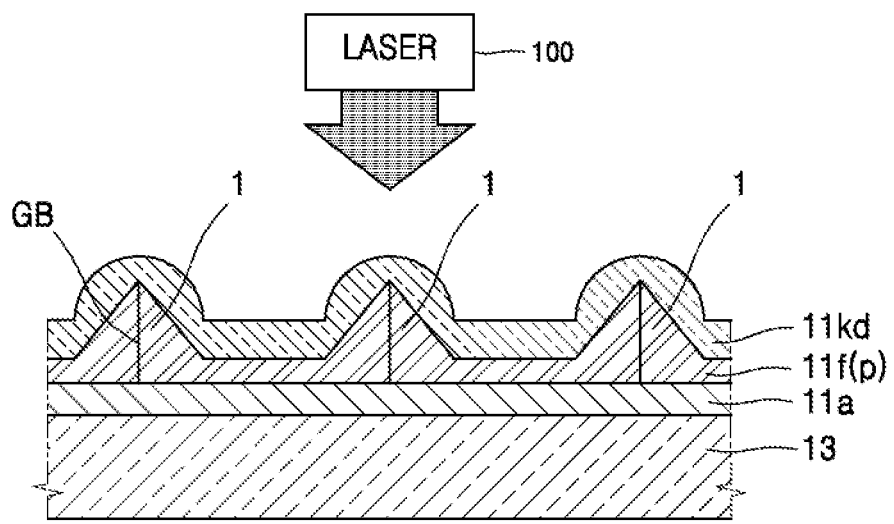

Here, referring to FIG. 1 and FIGS. 2A and 2B, the second portion 11f_2 is a portion formed when a cutting edge of a protuberance 1 that protrudes during a heat treatment process to form the active layer 11f is polished and a lower portion of the cutting edge is left. The first portion 11f_1 corresponds to a portion where the protuberance 1 is not generated. For example, to form the active layer 11f, a process of forming an amorphous silicon layer 11f(A) on a buffer layer 11a is performed and then crystallizing the amorphous silicon layer 11f(A) into a crystalline silicon layer 11f(p) through a heat treatment is performed. During the heat treatment process, the amorphous silicon layer may be liquidized or melt, and crystalline grains grow from the liquidized amorphous silicon layer and collide with each other to form the protuberance 1 with a grain boundary GB between the crystalline grains that collide to each other. The protuberance 1 with the grain boundary GB corresponds to the second portion 11f_2, and a grain inner portion in which the protuberance 1 is absent corresponds to the first portion 11f_1. If the protuberance 1 is left in a transistor, an electric field is concentrated on the protuberance 1 and an electric characteristic of a device may become very unstable as described above. According to an example embodiment of the present invention, the protuberance 1 has been polished and a pointed cutting edge has been removed.

A preliminary capping layer 11kp may enhance a heating efficiency during the heat treatment by covering the amorphous silicon layer 11f(A) and simultaneously protect a surface of the active layer 11f. For example, a heating efficiency of heat applied during the heat treatment may be maximized by covering the active layer 11f with the preliminary capping layer 11kp like a blanket, and the surface of the active layer 11f may be prevented from being damaged during a subsequent process, and thus deterioration of an electric characteristic may be suppressed. The reason why the preliminary capping layer 11kp on the first portion 11f_1 is not completely polished while the protuberance 1 is removed is for maintaining a function of protecting a surface of the active layer 11f.

The thin film transistor 11 provided to the display device 10 having the above configuration may be manufactured through a process shown in FIGS. 2A to 2F.

First, as shown in FIG. 2A, the amorphous silicon layer 11f(A), which will become the active layer 11f, is formed on the buffer layer 11a that is on the substrate 13, and the preliminary capping layer 11kp covers the amorphous silicon layer 11f(A). For example, the buffer layer 11a, the amorphous silicon layer 11f(A) and the preliminary capping layer 11kp may be formed on the substrate 13 in the listed order.

As shown in FIG. 2B, a heat treatment process is performed on the resulting structure of FIG. 2A to form the crystalline silicon layer 11f(p) with a protuberance 1. For example, the heat treatment process may include irradiating a laser beam with a laser irradiator 100. The heat treatment process may heat the amorphous silicon layer 11f(A) to a crystallization temperature of the amorphous silicon layer 11f(A) or greater, thereby transforming the amorphous silicon layer 11f(A) into a crystalline silicon layer 11f(p). For the laser beam, an excimer laser may be used, for example. For example, the amorphous silicon layer 11f(A) may be liquidized or melted and then crystalline grains may be formed from the liquidized amorphous silicon layer 11f(A). The crystalline grains adjacent to each other may collide to each other to form a grain boundary GB therebetween. The crystalline grains that collide to each other may form the protuberance 1 with the grain boundary GB therein.

In this case, as described above, when the crystalline grains grow and collide to each other, the protuberance 1 protuberates at a region where the grain boundary GB is formed. Since the heat treatment is performed with the amorphous silicon layer 11f(A) covered by the preliminary capping layer 11kp, a heating efficiency of the heat treatment is increased and thus the crystalline grains grow bigger as compared to if the heat treatment is performed without the preliminary capping layer 11kp and the protuberance 1 also increases in size. Due to the protuberance 1 of the crystalline silicon layer 11f(p), the preliminary capping layer 11kp may be deformed to a shape of the protuberance 1, and thus a deformed preliminary capping layer 11kd covers the protuberance 1 after the formation of the protuberance 1.

Figure 2C:
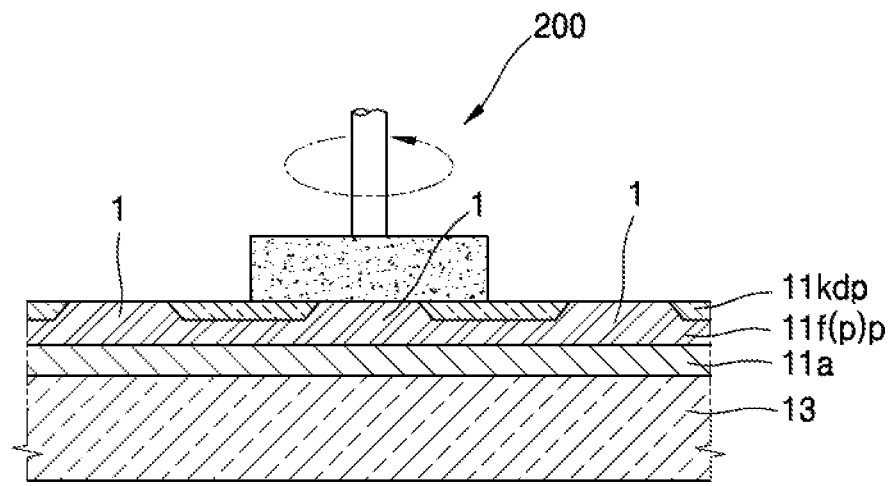

Therefore, since an electric field may be concentrated on a cutting edge of the protuberance 1 that have increased in size, the cutting edge is polished and removed by using a chemical mechanical polisher 200, as shown in FIG. 2C. In the polishing process, the deformed preliminary capping layer 11kd is polished to form a polished deformed preliminary capping layer 11kdp and the crystalline silicon layer 11f(p) with the protuberance 1 is polished to form a preliminary active layer 11f(p)p with a polished protuberance. In this case, the protuberance 1 is not completely removed so as to allow the polished deformed preliminary capping layer 11kdp to be left as a surface protective layer as described above. For example, if the crystalline silicon layer 11f(p) is planarized to the roots thereof by removing the protuberance 1 such that a thickness of the second portion 11f_2 of the active layer 11f equals to a thickness of the first portion 11f_1 of the active layer 11f, the active layer 11f is completely planarized in this manner and the deformed preliminary capping layer 11kd is completely polished and disappears. In this case, a surface of the preliminary active layer 11f(p)p is directly exposed. When the polishing is finished, a process of washing the surface is performed. Since the washing is performed under an atmospheric state, not a vacuum state, there is high possibility that the exposed surface of the preliminary active layer 11f(p)p may be damaged when the surface of the preliminary active layer 11f(p)p is fully exposed. Therefore, damage to the surface may be prevented by the polished deformed capping layer 11$kdp$ corresponding to at least the first portion 11$f$_1. Referring back to FIG. 1, an area of the second portion 11$f$_2 and an area of the first portion 11$f$_1 have a nearly similar size in an approximate cross-sectional view for convenience of description. However, since the protuberance 1 has a very thin and pointed shape, the first portion 11$f$_1 is overwhelmingly wider than the second portion 11$f$_2. Also, the second portion 11$f$_2 directly contacts the gate insulating layer 11$b$. In this case, since there is only the gate insulating layer 11$b$ as a single insulating layer between the active layer 11$f$ and the gate electrode 11$g$ without the capping layer 11$k$ therebetween, an effect that gate signal transfer becomes swifter may be obtained. For example, since a double insulating layer including the gate insulating layer 11$b$ and the capping layer 11$k$ is arranged between the first portion 11$f$_1 of the active layer 11$f$ and the gate electrode 11$g$, the first portion 11$f$1 is advantageous in protecting the surface but may be disadvantageous in transferring a gate signal, and the second portion 11$f$_2 may compensate for this disadvantage.

Figure 2D:
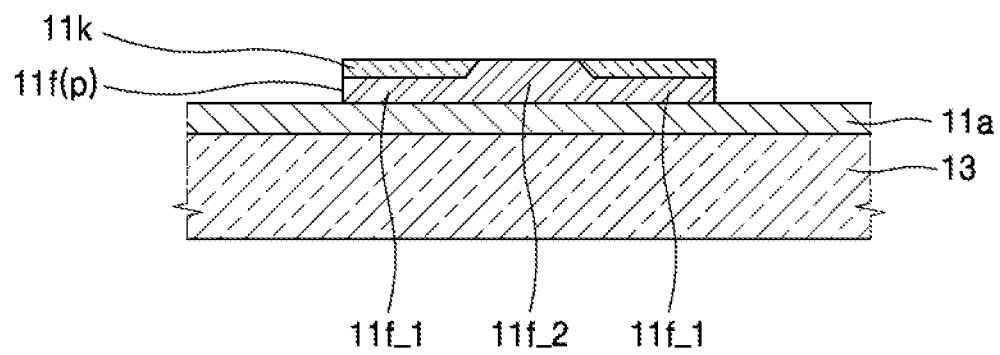

After the polishing is performed, as shown in FIG. 2D, the polished deformed preliminary capping layer 11$kdp$ and the preliminary active layer 11$f(p)p$ may be patterned in the same process to form the active layer 11$f$ and the capping layer 11$k$. For example, the capping layer 11$k$ includes a first capping layer and a second capping layer separated by the second portion 11$f$_2 of the active layer 11$f$. The active layer 11$f$ is patterned to have a predetermined size to be used for the thin film transistor 11.

Figure 2E:
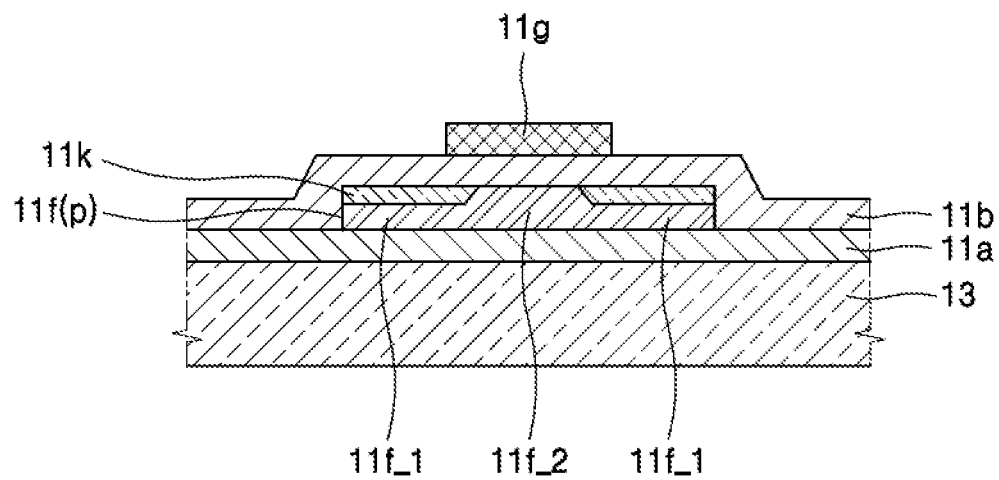
Figure 2F:
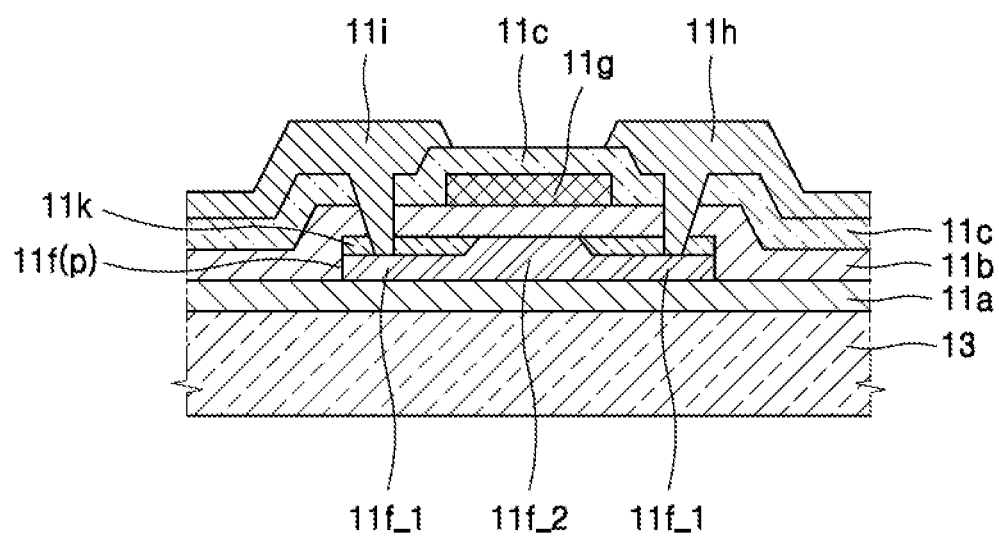

Next, as shown in FIG. 2E, the gate electrode 11$g$ is formed to face the active layer 11$f$ with the gate insulating layer 11$b$ therebetween, and subsequently, as shown in FIG. 2F, the interlayer insulating layer 11$c$, the source electrode 11$h$, and the drain electrode 11$i$ are formed. For example, the gate electrode 11$g$ is formed on the second portion 11$f$_2 of the active layer 11$f$.

Through this process, the thin film transistor 11 that resolves an instability factor such as concentration of an electric field on a specific portion while including the active layer 11$f$ having excellent charge mobility with large grains is implemented. Subsequently, when the light-emitting element 12 is formed, the display device 10 shown in FIG. 1 is manufactured.

Therefore, when the thin film transistor 11 and the display device 10 are implemented, a phenomenon that an electric field is concentrated may be alleviated by reducing grain boundary protuberances in size while making a large grain size of the active layer 11$f$, and damage to the surface of the active layer 11$f$ may be sufficiently suppressed by maintaining a capping layer as a protective layer during the manufacturing process.

Figure 3:
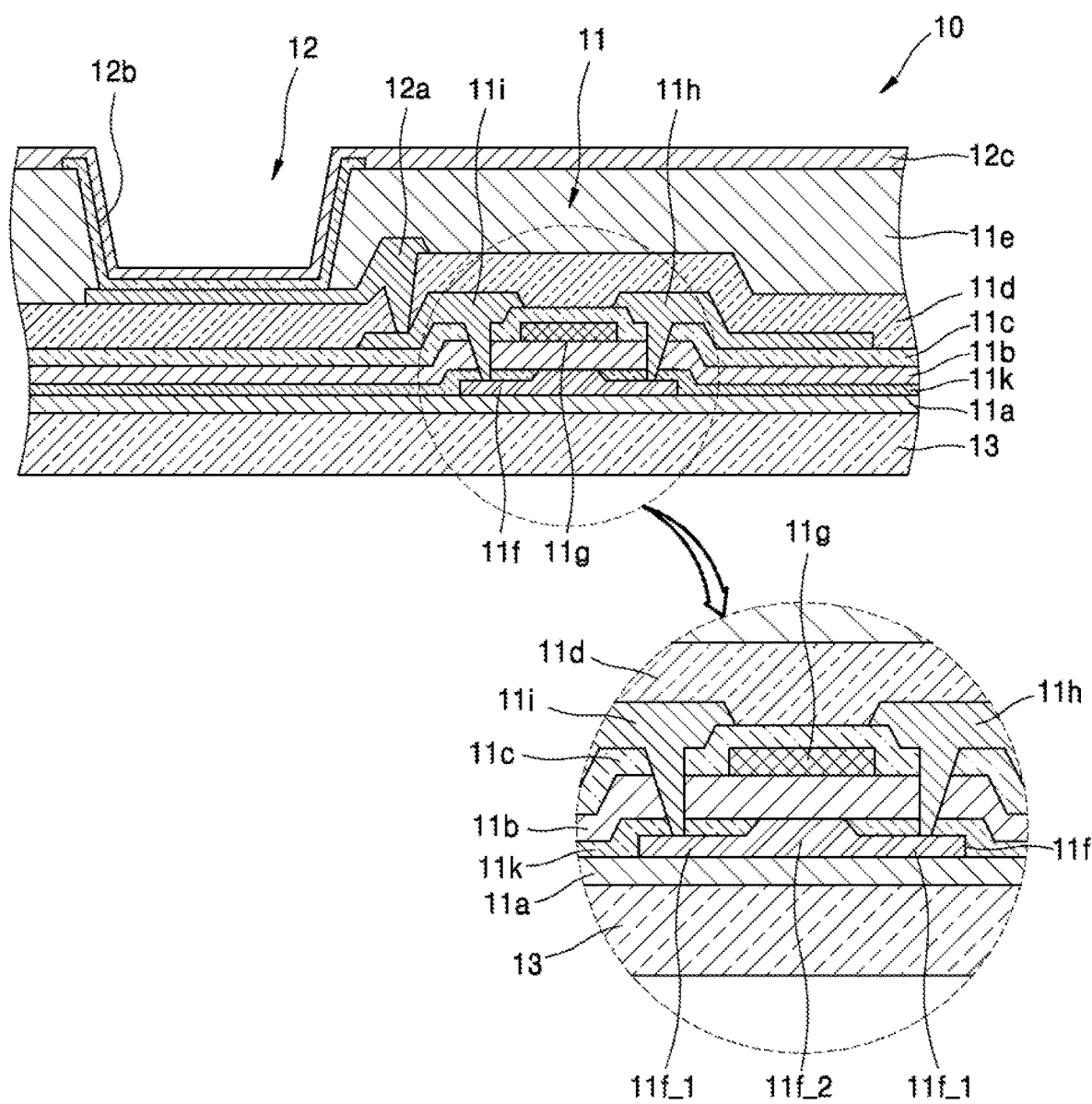
FIG. 3 is a cross-sectional view of a structure of a display device including a thin film transistor according to an embodiment of the present invention.

Next, FIG. 3 is a cross-sectional view of a portion of the display device 10 including the thin film transistor 11 according to an example embodiment.

In the display device 10 according to the present embodiment, the structures of the active layer 11$f$ and the capping layer 11$k$ of the thin film transistor 11 are formed different from those of the above embodiment. Since the other elements are the same as those of the above embodiment, descriptions thereof are omitted.

The active layer 11$f$ also includes the first portion 11$f$_1 that is relatively thin and the second portion 11$f$_2 that is relatively thick. For example, the first portion 11$f$_1 has a first thickness, and the second portion 11$f$_2 has a second thickness greater than the first thickness. For example, the first portion 11$f$_1 has a top surface lower than a top surface of the second portion 11$f$_2 with respect to an upper surface of the substrate 13. In an exemplary embodiment, the top surface of the first portion 11$f$_1 is connected to the top surface of the second portion 11$f$_2 via a sloped side surface.

In contrast, according to the present embodiment, the capping layer 11$k$ covers not only the first portion 11$f$-1 but also surroundings of the active layer 11$f$. For example, in FIG. 1, the capping layer 11$k$ covers only top surfaces, which are surfaces facing the gate electrode 11$g$ of the first portion 11$f$_1. In contrast, according to the present embodiment, the capping layer 11$k$ covers not only the top surfaces but also lateral surfaces of the active layer 11$f$, which are ends of the active layer 11$f$. With this structure, since the capping layer 11$k$ reduces a step difference by the active layer 11$f$, an effect of further reducing the possibility of electric field concentration is obtained. In other words, in the structure of FIG. 1, a height of the capping layer 11$k$ is added to a height of the active layer 11$f$ to form a step difference with respect to the surroundings of the active layer 11$f$. In contrast, according to the present embodiment, the capping layer 11$k$ relatively reduces the step difference by fully covering the surroundings of the active layer 11$f$, and thus further alleviates the electric field that is concentrated on a protruded portion in the surroundings.

The thin film transistor 11 having the above configuration may be manufactured through a process shown in FIGS. 4A to 4F.

Figure 4A:
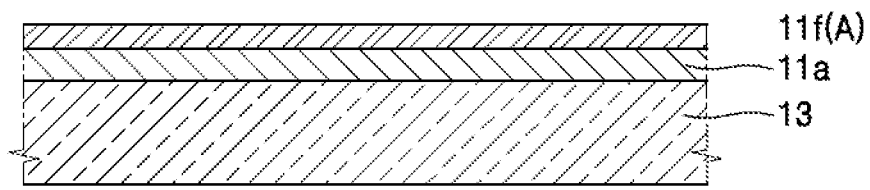
FIGS. 4A to 4F are sequential cross-sectional views of a process of manufacturing the thin film transistor shown in FIG. 3.

First, as shown in FIG. 4A, the amorphous silicon layer 11$f$(A), which will become the active layer 11$f$, is formed on the buffer layer 11$a$ that is on the substrate 13.

Figure 4B:
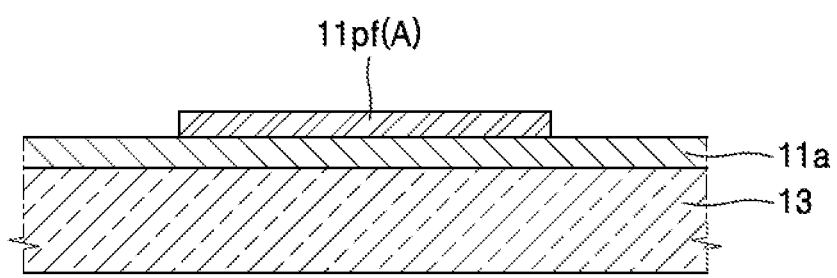

Next, as shown in FIG. 4B, the amorphous silicon layer 11$f$(A) is patterned first to form a patterned amorphous silicon layer 11$pf$(A) having a predetermined size to be used for the thin film transistor 11. For example, instead of patterning the amorphous silicon layer 11$f$(A) covered by the capping layer 11$k$, the patterning is performed first on the amorphous silicon layer 11$f$(A) before forming a preliminary capping layer 11$kp$ on the amorphous silicon layer 11$f$(A).

Figure 4C:
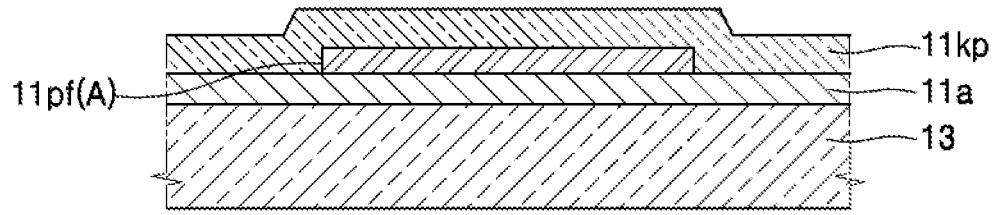

Next, as shown in FIG. 4C, the preliminary capping layer 11$kp$ is formed. In this case, the preliminary capping layer 11$kp$ is formed to cover not only a top surface of the patterned amorphous silicon layer 11$pf$(A) but also end lateral surfaces of the patterned amorphous silicon layer 11$pf$(A).

Figure 4D:
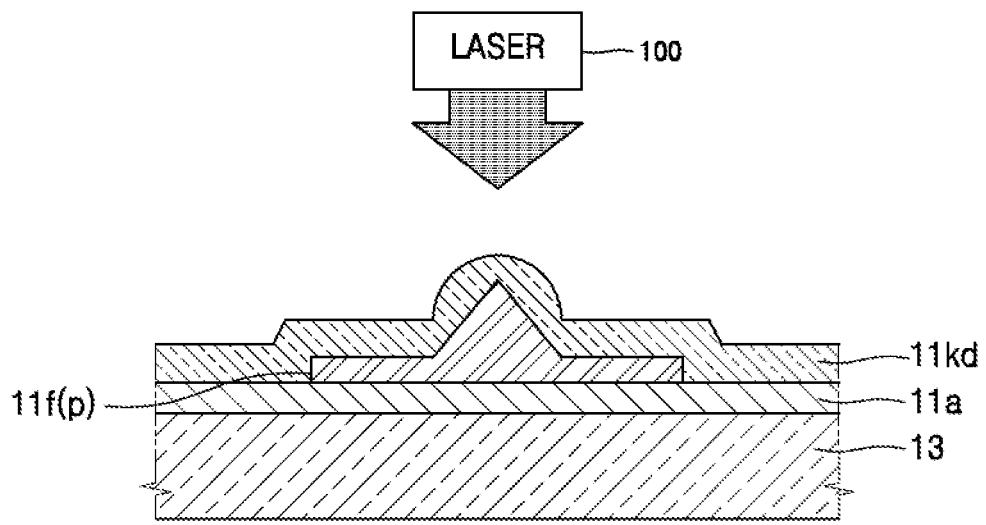

As shown in FIG. 4D, a heat treatment process is performed on a resulting structure of FIG. 4C. For example, the heat treatment process may include irradiating a laser beam with the laser irradiator 100 to heat the patterned amorphous silicon layer 11$pf$(A) to a crystallization temperature or greater, thereby transforming the patterned amorphous silicon layer 11$pf$(A) into a crystalline silicon layer 11$f(p)$. In this case, as described above, while crystalline grains grow and collide, protuberance 1 protuberate at a region where a grain boundary are formed between two colliding crystalline grains. Due to the protuberance 1 of the crystalline silicon layer 11$f(p)$ may deform the preliminary capping layer 11$kp$ to a shape of the protuberance, and thus a deformed capping layer 11$kd$ covers the protuberance 1 after the formation of the protuberance 1.

Figure 4E:
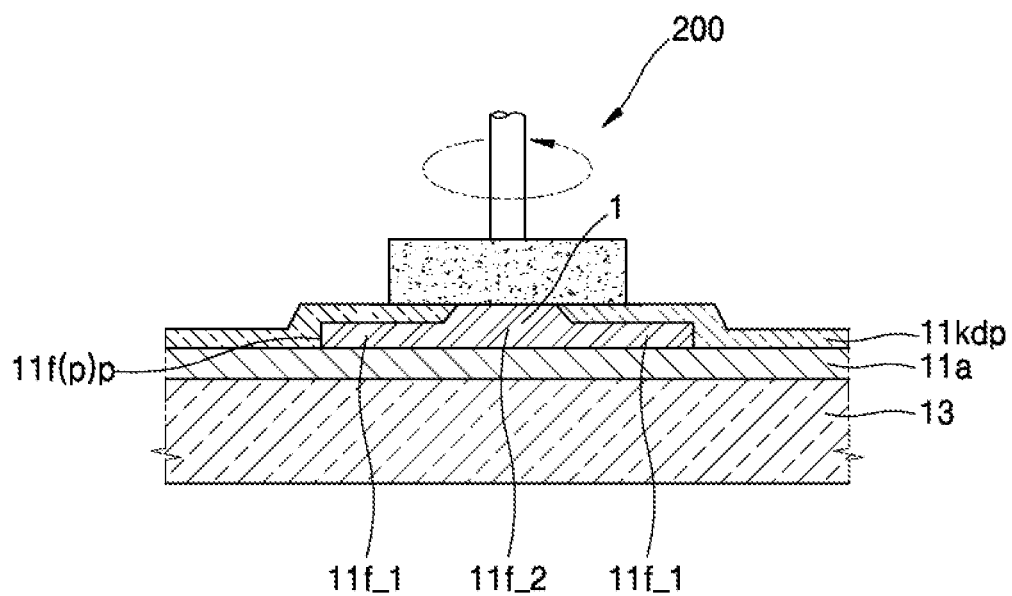

Subsequently, as shown in FIG. 4E, a cutting edge of the protuberances 1 is polished and removed by using the chemical mechanical polisher 200. In the polishing process, the protuberance 1 is not completely removed and is left to become the second portion 11$f$_2 to allow the deformed capping layer 11$kd$ to be left as a protective layer on the first portion 11$f$_1. For example, after the polishing process, the crystalline silicon layer 11$f(p)$ is changed to the active layer 11*f* and the deformed capping layer 11*kd* is changed to a polished deformed capping layer 11*kdp* which serves as the capping layer 11*k*.

Figure 4F:
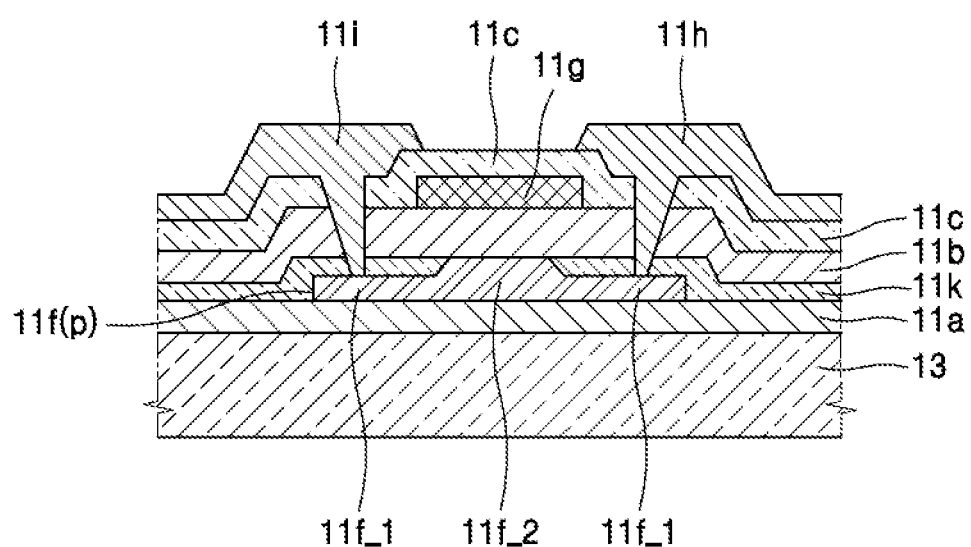

Next, as shown in FIG. 4F, the gate insulating layer 11*b*, the gate electrode 11*g*, the interlayer insulating layer 11*c*, the source electrode 11*h*, and the drain electrode 11*i* are sequentially formed. Here, the second portion 11*f*_2 directly contacts the gate insulating layer 11*b*.

Therefore, according to the present embodiment, the thin film transistor 11 that resolves an instability factor such as concentration of an electric field on a specific portion while including the active layer 11*f* having high charge mobility with large grains is implemented, and a step difference by the active layer 11*f* may be further reduced and thus an electric characteristic may be further stabilized.

Therefore, when the thin film transistor, the display device employing the thin film transistor, and the method of manufacturing the thin film transistor and the display device described above are used, electric field concentration may be alleviated by reducing grain boundary protuberances while increasing a grain size of the active layer, and damage to the surface of the active layer may be sufficiently suppressed by maintaining the capping layer as the protective layer during the manufacturing process. Accordingly, since an electric characteristic of the thin film transistor may be stabilized, the quality and reliability of a product employing the thin film transistor may be guaranteed.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A method of manufacturing a thin film transistor, the method comprising:
   forming an amorphous silicon layer over a substrate;
   forming a preliminary capping layer on the amorphous silicon layer;
   forming a crystalline silicon layer with a protuberance by performing heat treatment on the amorphous silicon layer in which the amorphous silicon layer is liquidized and then the liquidized amorphous silicon layer is crystallized to form the crystalline silicon layer with the protuberance and the preliminary capping layer is deformed to a shape of the protuberance;
   polishing the deformed preliminary capping layer and the protuberance to form a capping layer, and an active layer having a first portion having a first thickness and a second portion having a second thickness respectively,
   wherein a top surface of the second portion is coplanar with a top surface of the capping layer;
   forming a gate insulating layer on the capping layer and the second portion of the active layer;
   forming a gate electrode on the gate insulating layer, the gate electrode overlapping the active layer; and
   forming a source electrode and a drain electrode that penetrate the capping layer respectively to be connected to the active layer.

2. The method of claim 1,
   wherein after the polishing of the deformed preliminary capping layer and the protuberance, the protuberance of the crystalline silicon layer is reduced in height to form a preliminary active layer, and the deformed preliminary capping layer is left as a polished deformed preliminary capping layer, and
   wherein the preliminary active layer includes:
   a first portion, the deformed preliminary capping layer remaining on the first portion as a polished deformed preliminary capping layer; and
   a second portion corresponding to the protuberance reduced in height.

3. The method of claim 2, further comprising:
   patterning, after the polishing of the deformed preliminary capping layer and the protuberance of the crystalline silicon layer, the preliminary active layer and the polished deformed preliminary capping layer to form the active layer having a predetermined size, and the capping layer respectively.

4. The method of claim 1, further comprising:
   patterning the amorphous silicon layer to have a predetermined size,
   wherein the patterning of the amorphous silicon layer is performed before covering the amorphous silicon layer with the preliminary capping layer, and the preliminary capping layer covers a top surface and a lateral surface of the patterned amorphous silicon layer.

5. The method of claim 1,
   wherein the gate insulating layer directly contacts the second portion.

6. The method of claim 1,
   wherein the preliminary capping layer includes silicon oxide.

7. A method of manufacturing a display device, the method comprising:
   forming a thin film transistor over a substrate; and
   forming a light-emitting element connected to the thin film transistor,
   wherein the forming of the thin film transistor comprises:
   forming an amorphous silicon layer over the substrate;
   forming a preliminary capping layer on the amorphous silicon layer;
   forming a crystalline silicon layer with a protuberance by performing heat treatment on the amorphous silicon layer in which the amorphous silicon layer is liquidized and then the liquidized amorphous silicon layer is crystallized to form the crystalline silicon layer with the protuberance and the preliminary capping layer is deformed to a shape of the protuberance;
   polishing the deformed preliminary capping layer and the protuberance to form a capping layer, and an active layer including a first portion having a first thickness and a second portion having a second thickness greater than the first thickness respectively, wherein a top surface of the second portion is coplanar with a top surface of the capping layer;
   forming a gate insulating layer on the capping layer and the second portion of the active layer;
   forming a gate electrode on the gate insulating layer, the gate electrode overlapping the active layer; and
   forming a source electrode and a drain electrode that penetrate the capping layer respectively to be connected to the active layer.

8. The method of claim 7,
   wherein after the polishing of the deformed preliminary capping layer and the protuberance, the protuberance of the crystalline silicon layer is reduced in height to form a preliminary active layer, and the deformed preliminary capping layer is left as a polished deformed preliminary capping layer, and
   wherein the preliminary active layer includes:

a first portion, the deformed preliminary capping layer remaining on the first portion as a polished deformed preliminary capping layer; and a second portion corresponding to the protuberance reduced in height.

9. The method of claim 8, further comprising:

patterning, after the polishing of the deformed preliminary capping layer and the protuberance of the crystalline silicon layer, the preliminary active layer and the polished deformed preliminary capping layer to from the active layer having a predetermined size, and the capping layer respectively.

10. The method of claim 7, further comprising:

patterning the amorphous silicon layer to have a predetermined size, wherein the patterning of the amorphous silicon layer is performed before covering the amorphous silicon layer with the preliminary capping layer, and the preliminary capping layer covers a top surface and a lateral surface of the patterned amorphous silicon layer.

11. The method of claim 7, wherein the gate insulating layer directly contacts the second portion.

12. The method of claim 7, wherein the preliminary capping layer includes silicon oxide.

\* \* \* \* \*